(12) United States Patent
Liao

(10) Patent No.: US 7,581,963 B2
(45) Date of Patent: Sep. 1, 2009

(54) ELECTRICAL CONNECTOR

(75) Inventor: Fang-Chu Liao, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/217,987

(22) Filed: Jul. 10, 2008

(65) Prior Publication Data

US 2009/0017671 A1    Jan. 15, 2009

(30) Foreign Application Priority Data

Jul. 10, 2007    (CN)    ......................... 2007 2 0040630

(51) Int. Cl.
    *H01R 12/00*    (2006.01)
(52) U.S. Cl. ........................................ 439/71; 439/378
(58) Field of Classification Search .................... 439/71, 439/70, 379, 680, 66, 751, 603, 733.1
    See application file for complete search history.

(56) References Cited

U.S. PATENT DOCUMENTS

| 3,170,752 | A | * | 2/1965 | Horssen | .................... 439/733.1 |
| 3,546,656 | A | * | 12/1970 | Pritulsky | ..................... 439/191 |
| 3,713,072 | A | * | 1/1973 | Henschen et al. | ........... 439/425 |
| 3,918,784 | A | * | 11/1975 | Lemke et al. | ................. 439/70 |
| 3,999,827 | A | * | 12/1976 | Hutchison et al. | ............. 439/71 |
| 4,380,359 | A | * | 4/1983 | Hoffman et al. | ............... 439/81 |
| 4,620,757 | A | * | 11/1986 | Thevenaz | ................ 439/733.1 |
| 6,074,235 | A | * | 6/2000 | Brandberg et al. | .......... 439/378 |
| 6,860,028 | B2 | * | 3/2005 | Charest et al. | ................ 33/645 |
| 6,881,073 | B2 | * | 4/2005 | Bali et al. | ...................... 439/70 |
| 6,945,788 | B2 | * | 9/2005 | Trout et al. | ................... 439/66 |
| 6,966,783 | B2 | * | 11/2005 | Hachuda et al. | ............... 439/66 |
| 7,059,869 | B2 | * | 6/2006 | Wertz et al. | ................... 439/71 |
| 7,090,507 | B2 | * | 8/2006 | Wertz et al. | ................... 439/68 |
| 7,177,142 | B2 | * | 2/2007 | Kabadi et al. | ............... 361/679 |
| 7,278,855 | B2 | * | 10/2007 | Yasumura et al. | ............. 439/65 |
| 7,377,791 | B2 | * | 5/2008 | Liao et al. | ..................... 439/71 |
| 7,410,363 | B1 | * | 8/2008 | Gattuso et al. | ................ 439/71 |
| 2004/0253845 | A1 | * | 12/2004 | Brown et al. | .................. 439/66 |
| 2004/0253846 | A1 | * | 12/2004 | Brown et al. | .................. 439/66 |
| 2005/0266703 | A1 | * | 12/2005 | Noda et al. | .................... 439/66 |
| 2006/0068629 | A1 | * | 3/2006 | Nakajima | ................... 439/378 |

\* cited by examiner

*Primary Examiner*—T C Patel
*Assistant Examiner*—Vladimir Imas
(74) *Attorney, Agent, or Firm*—Wei Te Chung

(57) ABSTRACT

An electrical connector (100) for connecting an electronic package with a circuit substrate comprises an insulative housing (1), a number of contacts (4) and at least one alignment pin (2), the insulative housing (1) includes a plurality of passageways (116) for receiving the contacts (4) and at least one alignment holes (111), the insulative housing (1) also defines a number of spring ribs (112) extending into the alignment hole (111).

3 Claims, 5 Drawing Sheets

ELECTRICAL CONNECTOR

BACKGROUND OF THE INVENTION

1. Field of the Invention

The present invention relates to an electrical connector, and particularly to an electrical connector for electrically connecting electronic packages, such as Land Grid Array (LGA) Central Processing Units (CPU), with circuit substrate, such as printed circuit boards (PCB).

2. Description of the Prior Art

Referring to FIGS. 5-6, a conventional electrical connector 200 for electrically connecting a CPU (not shown) with a PCB (not shown) is illustrated. The electrical connector 200 comprises an insulative housing 10, a plurality of contacts 30 received in the insulative housing 10 and two alignment pins 20 for securely fixing the insulative housing 10 to the PCB. The insulative housing 10 comprises two alignment holes 101 corresponding to the alignment pins 20. The alignment hole 101 defines an inner surface 1011.

The alignment pin 20 interferences with the inner surface 1011 of the alignment hole 101 making the insulative housing 10 securely fixed on the PCB. But this fixing method makes the size of the alignment pin 20 difficult to control. When the alignment pin 20 is a little larger than the alignment hole 101, the alignment pin 20 can not be assembled into the alignment hole 101. When the alignment pin 20 is a little smaller than the alignment hole 101, the retaining force between the alignment pin 20 and the alignment hole 101 will not be enough for securely fixing the insulative housing 10 on the PCB.

In view of the above, a new electrical connector that overcomes the above-mentioned disadvantages is desired.

SUMMARY OF THE INVENTION

Accordingly, an object of the present invention is to provide an electrical connector that the size of the alignment pin is easy to control.

To fulfill the above-mentioned object, an electrical connector for electrically connecting an electronic package with a circuit substrate comprises an insulative housing comprising a plurality of passageways, at least one alignment hole and a number of spring ribs extending into the alignment hole, a number of contacts receiving in the passageways and at least one alignment pin.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
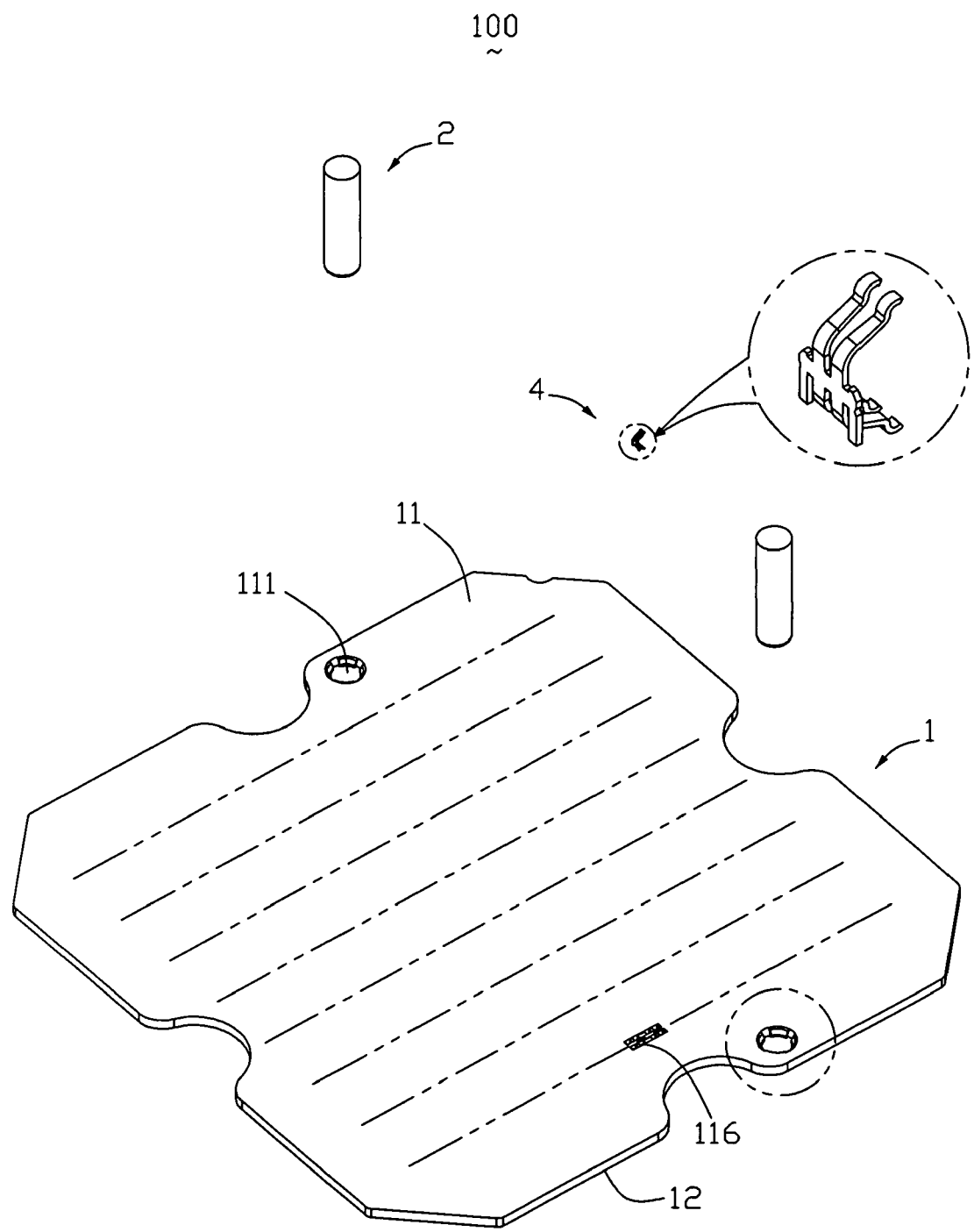
FIG. 1 is an exploded view of an electrical connector of the present invention.
Figure 2:
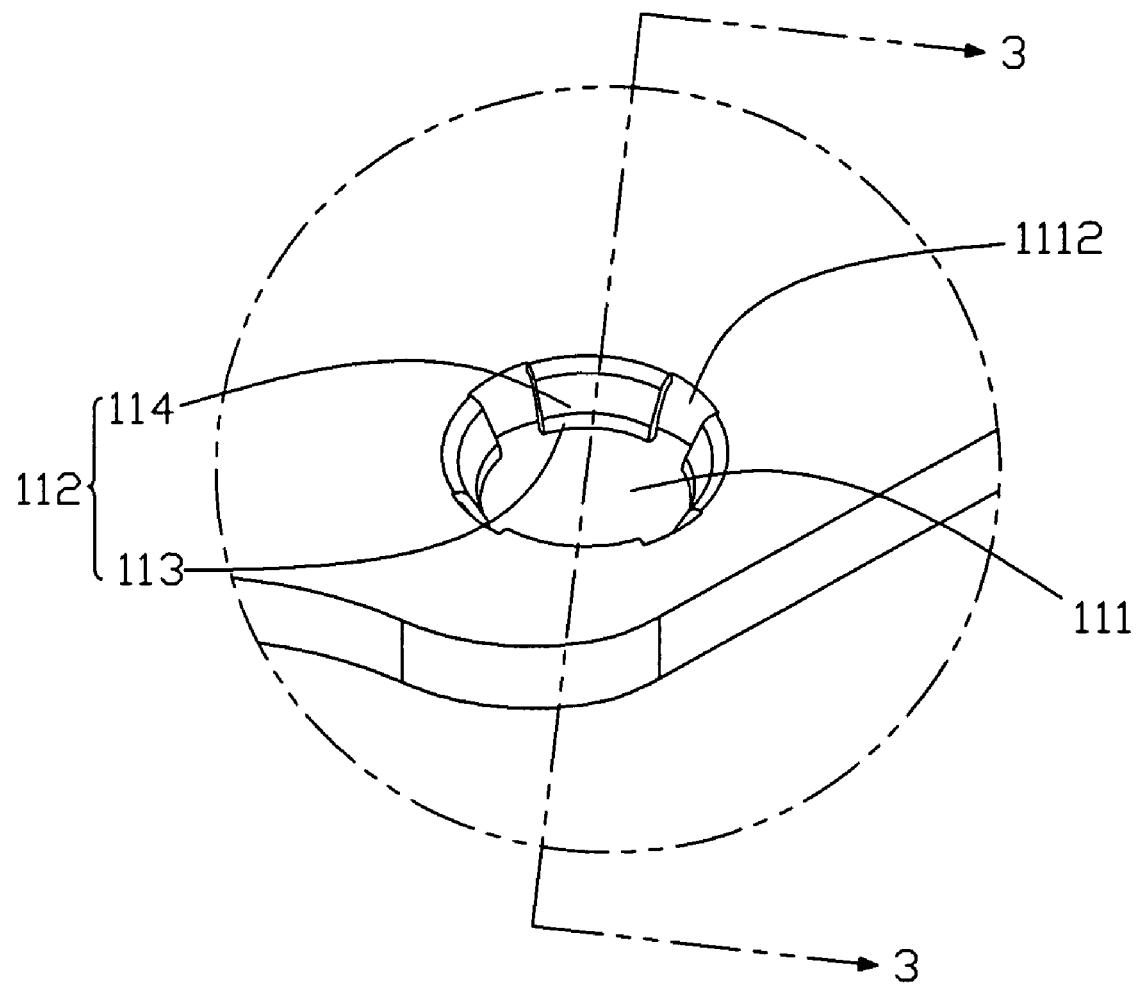
FIG. 2 is an enlarged view of a portion of FIG. 1.
Figure 3:
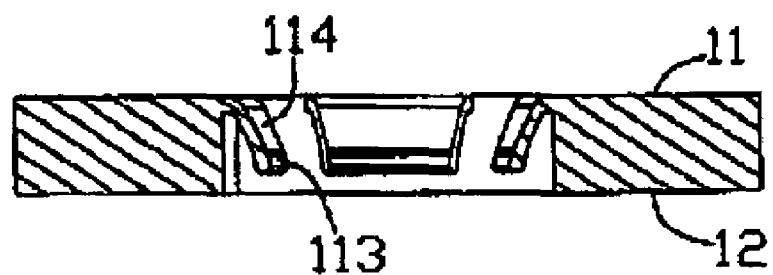
FIG. 3 is a side sectional view of the insulative housing according to the invention along lines 3-3 of FIG. 2.

Referring to FIGS. 1 to 3, an electrical connector 100 for electrically connecting an electronic package, such as an central processing unit (CPU) (not shown), with a circuit substrate, such as a printed circuit board (PCB) comprises an insulative housing 1, a number of contacts 4 and two alignment pins 2.

The insulative housing 1 is made of plastic with a plate-like shape and comprises a top surface 11 for confronting the CPU and a bottom surface 12 for being assembled to the PCB. The top surface 11 defines a plurality of passageways 116 impenetrate to the bottom surface 12 for receiving the contacts 4. The top surface 11 also defines two circular alignment holes 111 impenetrate to the bottom surface 12 and a number of spring ribs 112 extending into the alignment hole 111. The spring ribs 112 disposed in an hypodispersion mode and locate between the top surface 11 and the bottom surface 12, the spring ribs comprise a leading portion 114 extending from the top surface 11 and a retaining portion 113 connecting with the leading portion 114. The alignment hole 111 defines an inner surface 1112 and form a clearance 117 with the retaining portion 113.

Figure 4:
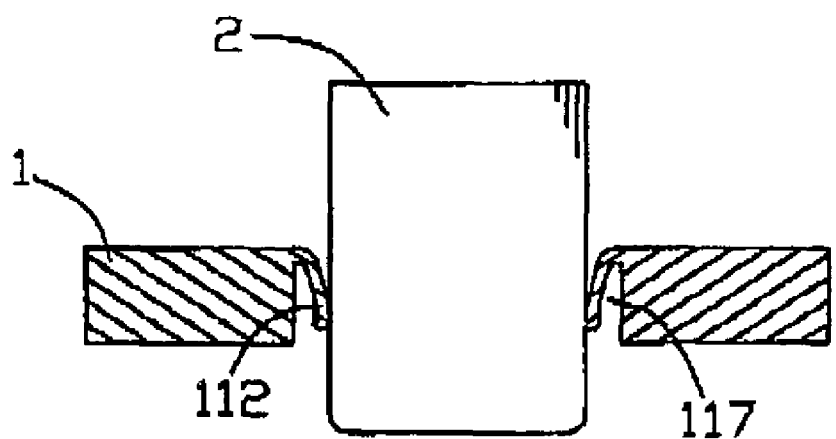
FIG. 4 is a view of the alignment pin touched with the retaining portion of the spring ribs.
Figure 5:
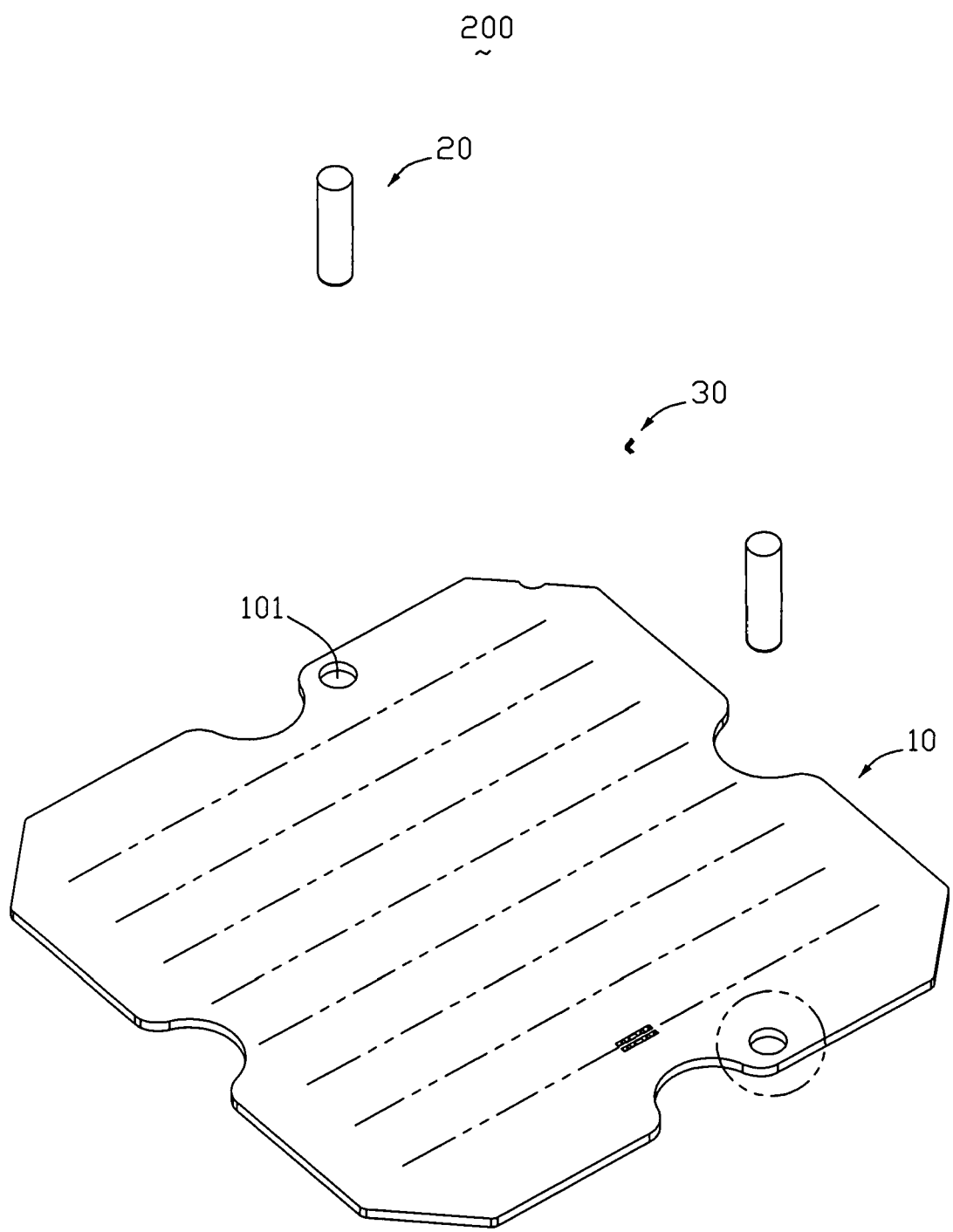
FIG. 5 is an exploded view of a conventional electrical connector.
Figure 6:
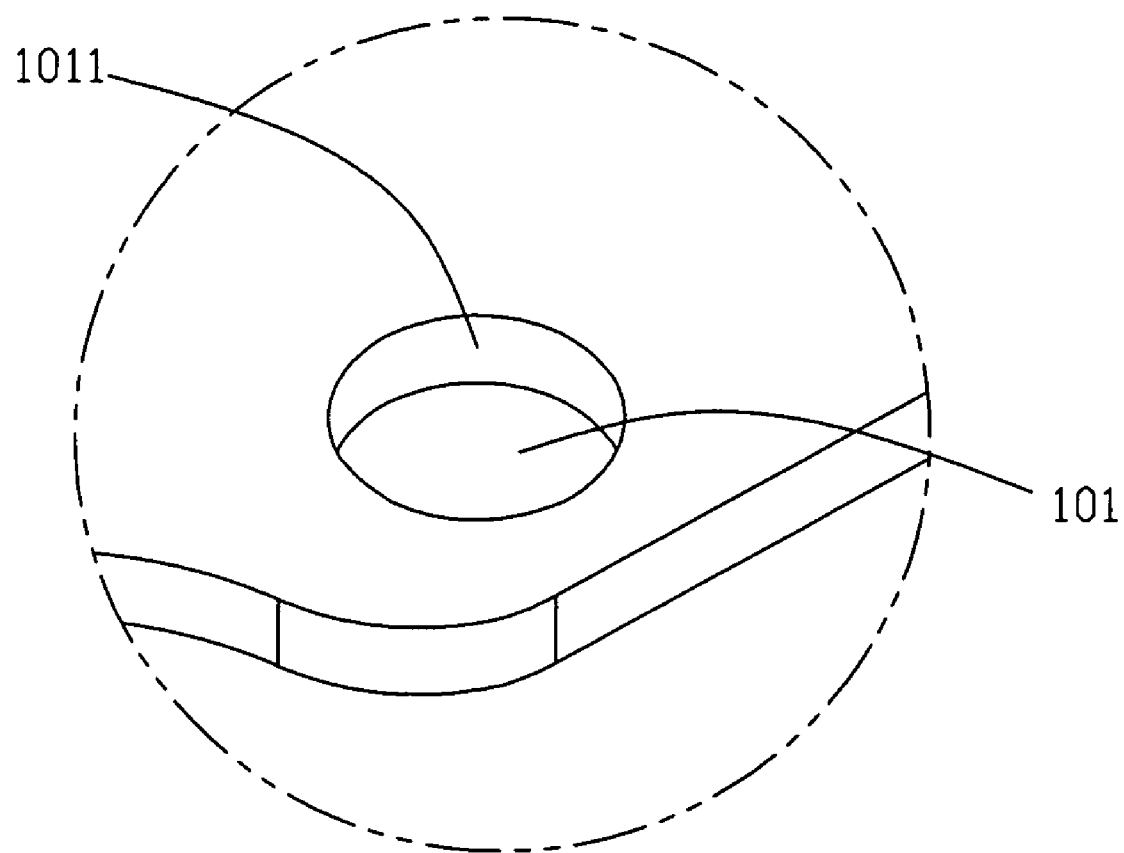
FIG. 6 is an enlarged view of a portion of FIG. 5.

Referring to FIG. 4, the alignment pin 2 is made of a column shape, when the alignment pin 2 is assembled to the insulative housing 1, the leading portion 114 of the spring rib 112 can leading the alignment pin 2 go through the alignment hole 111 and then touch with the retaining portion 113. In this process, the alignment pin 2 exerts an force to the spring ribs 112 make the spring ribs 112 to distort, similarly the distortion of the spring ribs 112 make an spring force to the alignment pin 2 make the alignment pin 2 securely located in the alignment hole 111, thus make the insulative housing 1 securely fixed on the PCB.

In the above detailed description, when the alignment pin 2 is assembled to the insulative housing 1, it exerts an fore to the spring ribs 112 make the spring ribs 112 to distort, similarly the distortion of the spring ribs 112 make an spring force to the alignment pin 2 make the alignment pin 2 securely located in the alignment hole 111, thus make the insulative housing 1 securely fixed on the PCB. At the same time, the size of the alignment pin 2 has a larger range, so the alignment pin 2 is easy to made.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
   an insulative housing defining a planar base with at least one alignment hole extending therethrough in a vertical direction;
   an alignment pin made of material stronger than the housing inserted into the alignment hole; and
   at least a pair of ribs each unitarily extending from a rim of the alignment hole into the alignment hole in a cantilevered manner with a gap between the rib and a corresponding area of an inner face of the alignment hole; wherein
   the alignment pin engages the rib and urges the rib toward the corresponding area to reduce while still keeping said gap.

2. The electrical connector as claimed in claim 1, wherein a root of said rib is located essentially on an upper face of the housing.

3. The electrical connector as claimed in claim 1, wherein said alignment is assembled to the alignment hole from the upper face of the housing downwardly.

* * * * *